United States Patent [19]

Davis et al.

[11] Patent Number: 4,893,271
[45] Date of Patent: Jan. 9, 1990

[54] SYNTHESIZED CLOCK MICROCOMPUTER WITH POWER SAVING

[75] Inventors: Walter L. Davis, Plantation; Barry W. Herold, Lauderhill, both of Fla.; Wendell L. Little, Austin, Tex.

[73] Assignee: Motorola, Inc., Schaumburg, Ill.

[21] Appl. No.: 18,761

[22] Filed: Feb. 26, 1987

Related U.S. Application Data

[63] Continuation of Ser. No. 842,056, Mar. 18, 1986, abandoned, which is a continuation of Ser. No. 549,954, Nov. 7, 1983, abandoned.

[51] Int. Cl.⁴ .......................... G06F 1/04; G06F 7/38
[52] U.S. Cl. ............................... 364/900; 365/227; 364/948.6; 364/948.8
[58] Field of Search .................. 364/200, 900; 377/47

[56] References Cited

U.S. PATENT DOCUMENTS

| | | | |
|---|---|---|---|
| 3,922,526 | 11/1975 | Cochran | 364/707 |
| 3,941,989 | 3/1926 | McLaughlin et al. | 364/707 |
| 4,234,929 | 11/1980 | Riley, Jr. | 364/703 |
| 4,267,577 | 1/5981 | Hashimoto et al. | 364/707 |
| 4,317,180 | 2/1982 | Lies | 364/707 |
| 4,384,361 | 5/1983 | Masaki | 455/31 |
| 4,477,919 | 10/1984 | Borras et al. | 377/47 |
| 4,479,191 | 10/1984 | Nojima et al. | 364/707 |

*Primary Examiner*—Eddie P. Chan
*Attorney, Agent, or Firm*—Vincent B. Ingrassia; Anthony J. Sarli, Jr.

[57] ABSTRACT

A microcomputer having predetermined clock pulse frequency requirements receives pulses from a multiplying type frequency synthesizer which utilizes a reference frequency less than the largest of the predetermined requirements. The synthesizer is responsive to program instructions to generate clock pulse frequencies sufficient to satisfy the requirement for immediate execution of programmed tasks. As the requirements change, the synthesizer responds to provide only the frequency required. Thus, the power dissipated by the microcomputer system is minimized.

23 Claims, 8 Drawing Sheets

SYNTHESIZED CLOCK MICROCOMPUTER WITH POWER SAVING

This is a continuation of application Ser. No. 842,056, filed Mar. 18, 1986, now abandoned, and which is a continuation of application Ser. No. 549,954, filed Nov. 7, 1983, now abandoned.

TECHNICAL FIELD

The present invention pertains to the control of the timing signals supplied to a microcomputer to alter the computational capabilities and power dissipation of the microcomputer.

BACKGROUND OF THE INVENTION

In most microcomputer applications, the microcomputer device is operated from a fixed frequency clock source that is typically a crystal oscillator circuit contained within the microcomputer circuitry. This configuration makes the structure of the microcomputer's timing circuitry simple, but it can limit the desired performance of the microcomputer system in terms of power drain and programming flexibility. In addition, this arrangement can also impact the overall cost of the microcomputer system.

In applications in which the computational requirements vary with time, the clock frequency must necessarily be set high enough to provide the computational power (computations/second) required to handle the most demanding task to be performed by the microcomputer. In these applications, the computer frequently operates at higher clock frequencies than would be required to perform the less demanding immediate tasks. Since all microcomputers, and especially CMOS microcomputers, dissipate more power at high operating frequencies than at low operating frequencies, it follows that CMOS microcomputers driven by the conventional fixed frequency clock signal source dissipate more power than they would if the clock frequency could be raised and lowered in accordance with the demands of the immediate tasks. This would greatly aid in reducing the power dissipation of the system and in addition, if the clock frequency were under program control, this would provide a more energy efficient microcomputer system.

One prior art system which attempts to reduce the adverse effects of these problems uses a programmable divider connected between a crystal oscillator clock source and the microcomputer. The modulus of the divider can be changed to provide either a high frequency or a low frequency clock signal input to the microcomputer in an effort to reduce the power dissipation of the microcomputer. However, here again, the base frequency of the crystal oscillator must be high enough to operate the microcomputer at the highest clock frequency required to handle the computational requirements of the most difficult of the preprogrammed tasks. Admittedly, some energy savings occurs when the microcomputer is operated at a lower clock frequency. But, the divider circuitry which enables reduction of the clock frequency is always operating at a high input clock frequency, and the power drain of the divider itself, together with the power drain of the high frequency oscillator, can severely impact the power drain of the total microcomputer system. In fact, in many applications in which there is a very large difference between the required minimum and maximum clock frequencies for microcomputer tasks, the crystal oscillator and programmable divider in combination draw significantly more power than would the microcomputer in its lower frequency, lower power drain mode. In addition, a problem exists in the fact that the operating frequency of most microprocessor crystal oscillators is in the range of from 1.0 MHz to 8.0 MHz. The crystal frequency control elements that are available in this range of frequencies are large in size and relatively expensive when compared to the much smaller low cost, low frequency (30 kHz to 100 kHz) crystals that have been developed primarily for electronic time piece applications. Thus there are substantial size, power and cost problems associated with the utilization of prior art apparatus.

SUMMARY OF THE INVENTION

Accordingly, it is the object of this invention to provide a variable clock frequency source for a microcomputer, the output frequency of which can be varied in accordance with the computational requirements of the microcomputer.

It is another object of the invention to provide a variable frequency clock source and a microcomputer such that the power drain of the combination is minimized for all operating clock frequencies.

It is another object of this invention to provide a variable frequency clock source for a microcomputer which is under the control of the program being executed by the microcomputer.

It is still another object of this invention to provide a variable frequency clock source for a microcomputer that uses miniature low frequency, low cost crystal reference elements in the oscillator circuit.

It is a further object of the invention to provide a variable frequency clock source that can be easily implemented on the same chip with a microcomputer using a number of integrated circuit technologies including CMOS technology.

According to an aspect of the present invention, a microcomputer is provided with a programmable clock frequency source that comprises a low frequency, crystal controlled clock source, a frequency multiplying type of frequency synthesizer, and a clock source selector. The frequency synthesizer is further comprised of a phase detector, a low pass loop filter, a Voltage Controlled Oscillator (VCO), and a programmable divider interconnected so that the output frequency of the synthesizer can be controlled by the microcomputer.

In operation, the output frequency of the frequency synthesizer can be varied over a wide range of values under direct control by the microcomputer. To minimize the system power drain, the frequency synthesizer and all of its constituent elements can be deactivated and placed in a mode in which they draw no power, while the lower frequency output of the crystal oscillator is used to directly supply clock pulses to the microcomputer. In a typical application, a standard 32 kHz timepiece crystal may be used in the crystal oscillator, and the frequency synthesizer used to generate clock frequency signals of up to 5.12 MHz, providing an adequate operating frequency range for the microcomputer, and correspondingly a power dissipation range of over 100 to 1.

BRIEF DESCRIPTION OF THE DRAWINGS

These and further objects and advantages of this invention can be more fully understood from the following detailed description in conjunction with the accompanying drawings in which.

DETAILED DESCRIPTION OF THE DRAWINGS

Figure 1A:
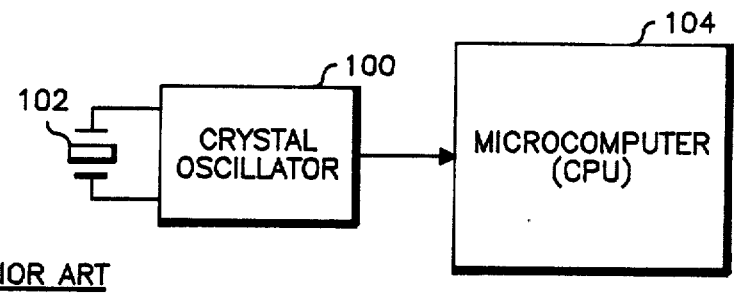
FIGS. 1A and 1B show prior art techniques for applying clock signals to microcomputers.

FIG. 1A shows the conventional approach that has commonly been used to supply clock signals needed for the operation of a microcomputer. Here, a crystal oscillator circuit 100 uses a conventional electrically excitable crystal element 102 to generate a stable clock signal at $f_{ref}$. The output of crystal oscillator 100 ($f_{ref}$) is applied directly to the clock and timing inputs of CPU 104 which also contains all of the peripheral circuits normally associated with the structure of a microcomputer. The crystal oscillator circuit 100 shown in FIG. 1 is operated continuously at a frequency $f_{ref}$ that, of necessity, must be sufficiently high to be capable of supporting the computational capabilities of the most demanding portions of the programmed procedures for the microcomputer. In many applications, as for example, in signal decoders used in paging receivers, the peak computational requirements placed on the microcomputer may be 100 times greater than the minimum computational requirements. Because of such utilization of the microcomputer, it may devote the majority of its time to executing the simple tasks that require minimum computational capabilities. In such applications, the configuration shown in FIG. 1A results in a considerably greater power dissipation than would be required if the clock frequency could somehow be adjusted to the value required to satisfy the computational needs of the task being executed by the microcomputer.

Consider, for example, the case in which the microcomputer must perform a repetitive series of programming tasks in which a peak clock $f_{ref}$ has the following values:

(a) 5.12 MHz is required for 0.100 seconds, (b) after which a clock frequency of 32 kHz is required for 0.900 seconds, followed by (c) a repetition of the (a) and (b) sequence. In addition, for ease of comparison consider the case in which the microcomputer and the clock circuitry are implemented with CMOS circuit elements, and the microcomputer is comprised of the Motorola MC146805E2 microprocessor and an MC65516 ROM.

It is well known that, over a wide range of operating frequencies, the power dissipation of CMOS circuits is directly proportional to the operating clock frequency.

Power dissipation = Constant x $f_{ref}$ where the value of the constant is dependent on the particular circuit configuration, which is normally fixed for any given circuit.

For the example outlined above, the current drain of the microcomputer would be 4 milliamperes from a 5 volt power supply when the microcomputer is operated at 5.12 MHz clock rate. The microcomputer current drain would be reduced to 0.025 milliamperes from the 5 volt power supply if the clock frequency were reduced to 32 kHz.

Similarly, a typical CMOS crystal controlled oscillator, such as the one used on the MC146805E2 microprocessor, would draw 0.8 milliamperes from a 5 volt supply when operated at a frequency of 5.12 MHz, but would draw only 0.005 milliamperes if the oscillator frequency were reduced to 32 kHz.

Thus, for the system shown in FIG. 1A, in which the clock frequency must be set at 5.12 MHz, the average power dissipation is:

$$\begin{aligned}\text{Power Dissipation} &= V \times I \\ &= (5.0 \text{ Volts}) \times (0.8 + 4.0 \text{ ma}) \\ &= 24 \text{ milliwatts}\end{aligned}$$

However, if the clock frequency could somehow be adjusted to conform to the minimum requirements of the instantaneous task, the Power Drain could be as low as:

Power Dissipation $= 0.1 \text{ V} \times I_{HIGH} + 0.9 \text{V} \times I_{LOW}$
$= 0.1(5 \text{ Volts})(4.8 \text{ ma}) + 0.9(5 \text{ Volts})(0.03 \text{ ma}) = 2.54$ milliwatts and the difference of 21.4 milliwatts between the two power dissipations shows a net power savings of 90% could be achieved. Thus, for this example, the prior art circuit dissipates nearly ten times as much power as would be required if the clock frequency could be varied in accordance with the instantaneous computational requirements of the microcomputer.

A second limitation of the configuration shown in FIG. 1A is that the microcomputer is restricted to using one clock frequency as a time base for timing elapsed time intervals and for executing programs. In many applications, it would be desirable to have a high frequency time base available so that small time intervals could be measured with a high degree of accuracy, and to also have a low frequency time base available so that long time intervals could be measured without requiring the use of very large timing circuits within the microcomputer. In addition, many programming tasks such as sampling input signals at variable rates, generating output signals with different prescribed frequencies, etc., can be performed more easily if the clock frequency could be modified and tailored to meet the requirements of the program being executed by the microcomputer.

Figure 1B:
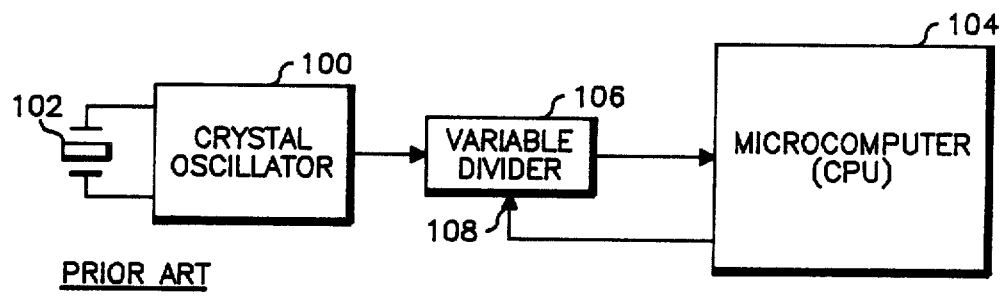

FIG. 1B shows a functional block diagram of a second prior art configuration in which the output of a crystal oscillator 100 ($f_{ref}$) is connected to the input of a variable frequency divider 106. The output of the divider is connected to the clock input of the microcomputer 104, and an output of microcomputer 104 is further connected to a control input 108 of variable divider 106.

The variable divider in FIG. 1B has a divider modulus that can be changed by the microcomputer via the control signal applied at terminal 108. In operation, divider 106 is set to a low modulus to divide $f_{ref}$ by a small divisor and operate the microcomputer at a high clock frequency when a high computational capability is required. The divider 106 may also be set to a high modulus to divide $f_{ref}$ by a high divisor and operate the microcomputer at a low clock frequency when a low computational capability is required.

The prior art structure in FIG. 1B improves some of the limitations associated with the structure in FIG. 1A, but it does not eliminate them totally. In particular, the structure in FIG. 1B still requires the use of a physically large and relatively expensive clock crystal 102 to produce the high clock frequency required. It does improve the power drain problems when the microcomputer is operated at very low clock speeds but the power drain associated with the high frequency clock oscillator and the variable divider can easily be many times greater than the power dissipated by the microcomputer. Thus, for IC's manufactured with the same semiconductor processing as the microprocessor, the current drain required to operate a CMOS crystal oscillator circuit 100 and an associated frequency divider circuit such as 106 at an oscillator frequency of 5.12 MHz is typically 1.0 milliampere from a 5 Volt power supply. This corresponds to a power dissipation of 5 mW.

Taking the same example programming task cited previously, the power dissipated by a system similar to that shown in FIG. 1B would be:

Average Power Dissipation = 0.1(5 volts)(5.0 ma) + 0.9(5 volts)(1.025 ma)

Average Power Dissipation = 7.1 mW

Subtracting the 5 mW power due to the oscillator and divider combination results in an average power drain of only 2.1 milliwatts that is dissipated in the microcomputer. Thus, the oscillator and the divider dissipate almost two and a half times the power dissipated in the microcomputer.

Further, in this approach, the microcomputer can only be clocked at frequencies that are integer submultiples of the oscillator frequency, so the ability to change the clock frequency to values that allow for efficient programming of the microcomputer is severely limited. For example, for an oscillator frequency of 5 MHz, only clock signal frequencies of 5.0 MHz, 2.5 MHz, 1.66 MHz, etc., can be generated corresponding to divisors of 1, 2, 3, etc. The large gaps in the output frequencies that occur for low divisors severely limit the operation of the system, for it is precisely at the high operating clock frequencies that a large number of closely spaced alternative clock frequencies are needed. Thus, the configuration shown in FIG. 1B also has several additional shortcomings that will be addressed by the present invention.

Figure 2:
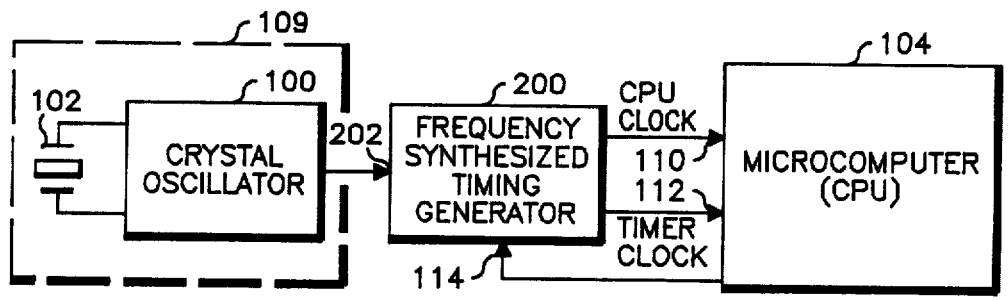
FIG. 2 is a functional block diagram of the basic configuration of the invention.

FIG. 2 shows a functional block diagram of the present invention. As in the prior figures, crystal oscillator 100 is coupled to crystal element 102. Oscillator 100 and crystal 102 are shown enclosed by a broken line box designated 109 to represent the source of timing signals supplied to a frequency synthesized timing generator 200. Crystal oscillator 100 has its output signal connected to frequency synthesized timing generator 200 by means of a reference clock input terminal 202. Two output signals of frequency synthesized timing generator 200 are connected to microcomputer 104 at a CPU clock input terminal 110 and a timer clock input terminal 112. An output control line from microcomputer 104 is connected to a control input 114 of frequency synthesized timing generator 200.

In operation, the crystal oscillator 100 in combination with crystal 102 generates accurate, low frequency crystal controlled output signals that preferably have a frequency of between 30 kHz and 100 kHz. By using a reference clock time base in this frequency range, the power drain of the oscillator circuit can be kept to a minimum, and consequently low cost, physically small time piece crystals may be used as the crystal frequency reference elements. To allow the use of smaller and lower cost crystals, the low frequency clock signals from the crystal oscillator 109 are applied to reference clock input 202 of frequency synthesized timing generator 200. Functional block 200 contains a frequency multiplying type of frequency synthesizer, and timing and selection logic that generates the two output signals that are applied to the clock and timer inputs of the microcomputer.

The frequency synthesizer contained within timing generator 200 generates an output frequency of:

$$f_{syn} = M \cdot f_{ref}$$

where $f_{ref}$ is the frequency of the signal applied to the clock reference input terminal 202, and M is an integer factor that can be controlled by the microcomputer by means of the control interface input terminal 114 in timing generator 200. In the preferred embodiment, the timing and selection logic in timing generator 200 allows either the reference frequency signal from crystal oscillator 109 or the output signal $f_{syn}$ from the synthesizer to be applied to either or both of the clock and timer input terminals of the microcomputer. In addition, the frequency synthesizer is configured so that it can be totally disabled in a zero power drain state while the crystal oscillator output signal is applied directly to both the clock and timer input terminals of the microcomputer.

The system shown in FIG. 2 is presented in greater detail in FIGS. 3, 4, 5A, 5B, 5C, 5D, 6 and 7A-F, and is described in detail in the following sections. When the system configuration described herewithin is used to execute the sample time varying program considered previously, the overall power dissipation is significantly reduced.

In particular, the same CMOS oscillator that is part of the oscillator and divider configuration of FIG. 1B draws only 5 microamperes when operated at a frequency of 32 kHz. The frequency synthesized timing generator 200 draws 0.5 milliampere when generating a 5.0 MHz output signal, and has zero current drain when it is disabled so that the output of crystal oscillator 100 is applied directly to both clock input terminals 110 and 112 of microcomputer 104. The power dissipation utilizing the present invention to execute the sample programming sequence is then:

Average Power Dissipation = 0.1(5 volts)(4.5 ma) + 0.9(5 volts)(0.030 ma) = 2.36 mW which is more than a 10 times improvement over the power drain of the system shown in FIG. 1A, and a 3 times improvement over the power drain of the system shown in FIG. 1B.

Further, it can be appreciated that, by using a low frequency crystal reference signal, the synthesized output frequency can be varied in relatively small frequency steps which allow the microcomputer clock frequency to be closely adjusted to preferred frequency values to improve the efficiency of the computer and increase the utilization of power during computer program execution. For example, for an oscillator frequency of 32 kHz, 160 different synthesized output frequencies between 32 kHz and 5.12 MHz can be generated, with each frequency being a multiple of 32 kHz. This set of available frequencies has the desirable characteristic that, at the higher frequencies which will be used to clock the microcomputer when its most demanding programmed tasks are being executed, there are a large number of closely-spaced clock frequencies that can be selected to ease the task of programming the computer and to increase the efficiency of the operation of the microcomputer. Moreover, it should be clear that the utilization of a crystal reference clock time base frequency less than the frequency required by the most difficult tasks to be performed by the microcomputer in combination with a multiplying type of frequency synthesizer provides an optimum power savings. When the frequency selection is made responsive to the computer task being performed this produces a remarkably energy efficient microcomputer system.

Figure 3:
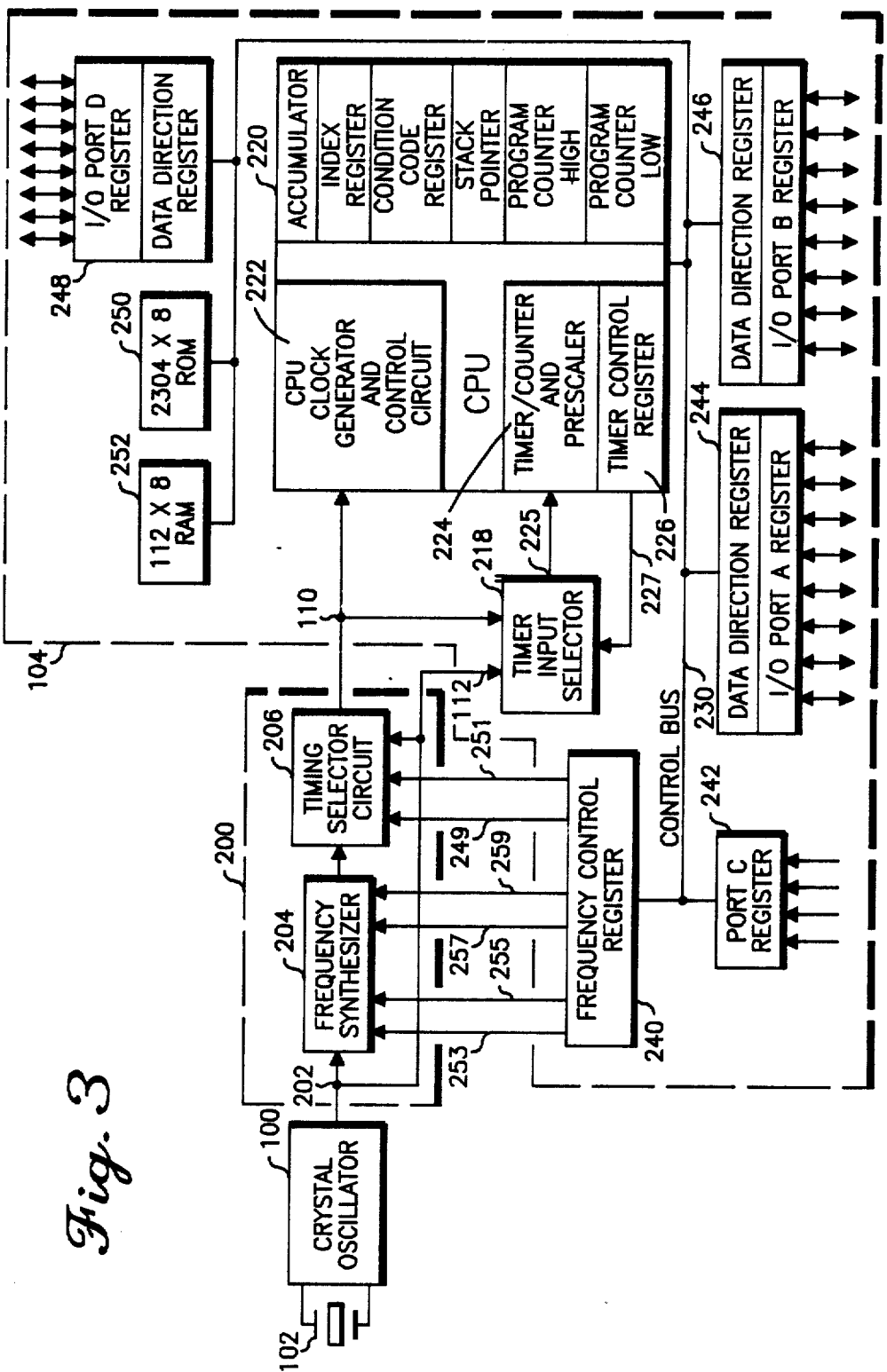
FIG. 3 is a more detailed functional block diagram that shows the elements of the invention.

FIG. 3 shows in more detailed functional block diagram form the system of FIG. 2. Here, the frequency synthesized timing generator 200 and the microcomputer 104 are broken down to their constituent elements. The output of crystal oscillator 100 is connected to the reference oscillator input terminal 202 of a frequency synthesizer 204, to an input of timing selector circuit 206 and to an input terminal 112 of a timer input selector 218 in microcomputer 104. The output signal of frequency synthesizer 204 provides a second clock input for timing selector 206. The output signal of timing selector circuit 206 is connected to the clock input terminal 110 of microcomputer 104 and to a second input of timer input selector 218.

Microcomputer 104 contains a CPU 220 that in turn contains, among other elements, a CPU clock generator and control circuit 222, a timer/counter and prescaler 224, and a timer control register 226. It will be appreciated by those skilled in the art that the CPU clock generator acts as the source clock for all internal CPU instruction timing and address/data operations. The timer/counter is used primarily for timing operations and functions as a programmable elapsed time measurement element. CPU 220 is also shown as containing an accumulator index register, stack pointer, and various other modules well known to be included in a CPU. The CPU is connected by means of bi-directional control bus line 230 to a frequency control register 240, a port C input register 242, an I/O port A register 244, an I/O port B register 246, and I/O port D register 248, a program ROM 250, and a RAM 252.

An output control line 227 from timer control register 226 is coupled to a third input of timer input selector 218, and the output terminal 225 of selector 218 is connected to an input of timer/counter and prescaler 224. Timer circuit selector 218 also receives the clock source signal from oscillator 100 at terminal 112. Thus, timer input selector 218 is provided with timing signals from both crystal oscillator 100 and synthesizer 204.

Two output control signal lines 249 and 251 from register 240 are connected to timing selector circuit 206. These lines provide clock selector control and power up or reset control, respectively. Four additional output control signal lines 253, 255, 257, 259 from the frequency control register 240 are supplied to frequency synthesizer 204 to provide respectively ON/OFF, bandwidth control, and frequency control signals. The number of lines is not intended to be limiting but only exemplary of the functional interconnections.

The system shown in FIG. 3 operates in the following manner. When the system is first turned on or energized, the frequency synthesized timing generator 200 cannot instantaneously lock and provide a stable output frequency that is suitable for clocking the microcomputer. To overcome this problem, the registers in the microcomputer 104, including the timer control register 226 and the frequency control register 240 are initialized to predetermined states by power-up initialization techniques that are well known in the art. The predetermined initial conditions in timer control register 226 and the frequency control register 240 result in the generation of control signals via control lines 249 and 251 to the timing selector circuit 206 and via control line 227 to the timer input selector 218, that select the output of the crystal oscillator 100 as the clock signal applied to the clock input terminals 110 and 112 of the microcomputer. In response to these control signals, the timing selector circuit 206 applies the crystal oscillator output signal that is connected to one of its input terminals; to terminal 110 which is the CPU clock input terminal of the microcomputer. Similarly, the timer input selector 218. connects the crystal oscillator output signal that is supplied to its input terminal 112 to its output terminal 225 which is in turn connected to the timer/counter and prescaler 224 in the microcomputer.

Since the CPU clock generator and control circuit 222 generates the timing signals that are used internally to clock the various elements of the CPU, it, therefore, provides the timing control for all instruction, data, and address operations. Thus, the frequency of the signal applied to clock input terminal 110 determines the execution cycle time of the microcomputer, and for a CMOS microcomputer, it directly determines the resulting power drain of the microcomputer. Similarly, timer/counter and prescaler circuit 224 is used by the microcomputer as an elapsed time timer, and timer input selector 218 functions to select either the output of the crystal oscillator or the output of the frequency synthesized timing generator as the time base signal for timer/counter and prescaler 224. Although the synthesizer operation is controlled by the requirements of the CPU clock generator circuit, it is clear to those skilled in the art that an additional timing selector circuit 206 coupled to timer input selector 218 would allow the synthesizer output to be utilized for elapsed time measurement regardless of the requirements of the CPU clock generator.

Thus, immediately after the system is activated, the output of the crystal oscillator is used to clock the CPU, and as the time base for the timer/counter and prescaler. In this mode, the microcomputer is fully functional and, depending on the task programmed in the program ROM, it is capable of activating the frequency synthesizer and subsequently applying the resultant high frequency signals to either its clock signal input terminal 110 or to timer/counter 224.

To activate the frequency synthesizer, the CPU writes a control sequence into the frequency control register 240 to turn on the frequency synthesizer, set its bandwidth to the wide bandwidth state, and set its output frequency. The control sequence generates signals on the ON/OFF control line 253, the bandwidth control line 255, and the frequency control lines 257 and 259 that act to physically turn on the synthesizer, set its loop bandwidth to the wide bandwidth state, and set the output frequency to the desired value by setting the programmable divider in the synthesizer to the proper divisor.

After the synthesizer has been turned on with the phase-locked loop in the wide bandwidth mode, the loop quickly synchronizes or achieves lock, and the output frequency is then locked to the desired value. However, with the phase locked loop in the wide band mode, the synthesizer output may contain too much noise and frequency jitter to be useable as a stable clock time base. Thus, to narrow the loop bandwidth and improve stability of the loop, the microcomputer next writes a new control sequence into the frequency control register 240 to change the state of the bandwidth control line 255. This new control sequence does not change the state of the frequency control signals 257 and 259 or the state of the ON/OFF line 253, but only changes the state of the bandwidth control line 255 to place the phase locked loop in its narrow bandwidth mode.

Then, after some short delay to allow the transient caused by the loop bandwidth change to die out, the output of the frequency synthesizer is stable and suitable for use as a clock source for the microcomputer. The microcomputer then can switch either the timing selector circuit 206 or its timer input selector or both to apply the output of the frequency synthesizer 204 to either or both of the CPU clock input terminal 110 and the timer/counter input terminal 225.

The frequency synthesizer output can be applied to the CPU clock input terminal by writing a control sequence into the frequency control register 240 that changes the state of the clock selector control signal 249 to switch the output signal of timing selector circuit 206 from the crystal oscillator output to the synthesizer output. Similarly, the timer input signal at terminal 225 can be changed from the crystal oscillator signal to the output of the timing selector 206 by writing a new control sequence into the timer control register 226 to change the state of the signal on control line 227.

In the system shown in FIG. 3, the microcomputer can turn the frequency synthesizer ON or OFF at any time. Further, it can independently select either the output of the crystal oscillator or the output of the frequency synthesizer as the source of clock signals for the CPU clock and timer clock inputs. The output frequency of the frequency synthesizer can be set or changed to any one of a number of programmable frequencies. Although only four possible frequency settings could be provided by the two frequency control lines shown, this number is merely used as an example and is not intended to be limiting.

The preferred embodiments for the functional elements shown in FIG. 3 also provide several important protective features that prevent the CPU from placing the system in a non-operative state. In particular, since the CPU would suddenly stop operation and become inoperative if it affected the selection of a non-functioning clock source, the designs of the individual elements will not allow the CPU clock input terminal or the timer clock input terminal to receive the output of the frequency synthesizer if the synthesizer is not ON. Further, the design will not allow the frequency synthesizer to be switched OFF if it is being used as a source of clock or timing signals. The details of the designs of the various elements and the manner in which they support the overall operation of the system are discussed in the following sections.

Figure 4:
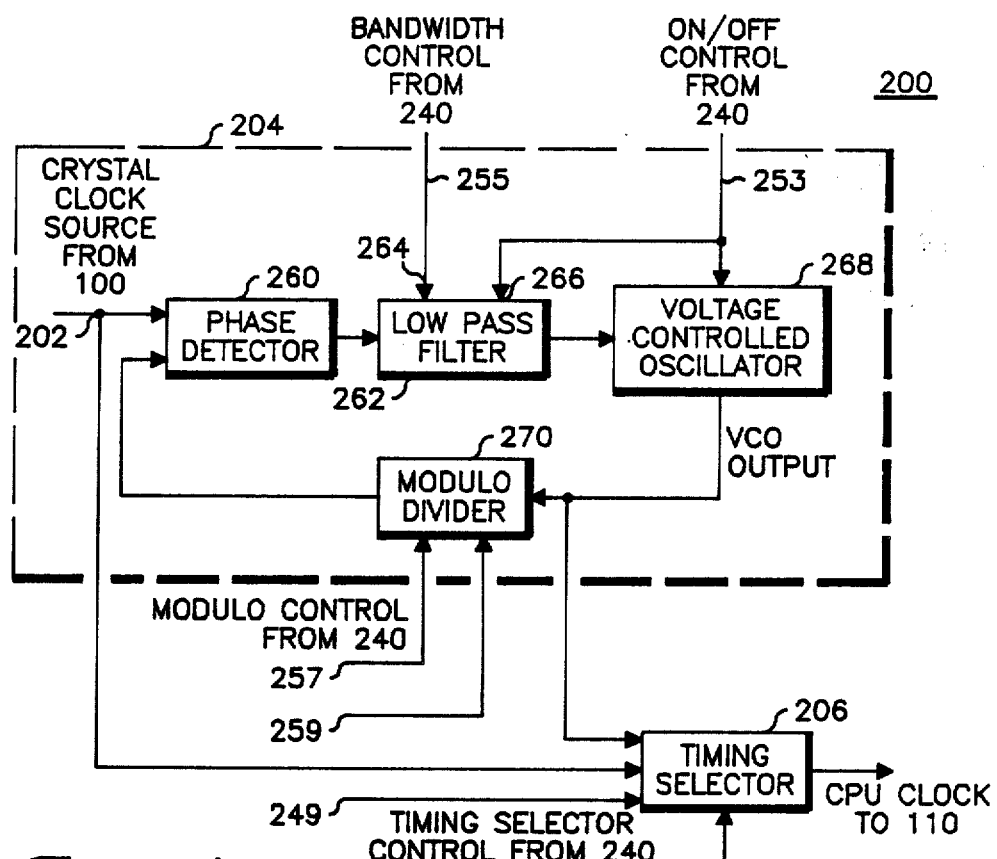
FIG. 4 shows the detail block diagram of the frequency synthesized timing generator of FIG. 3.

FIG. 4 is a block diagram representation of timing generator 200 that consists of a conventional phase lock loop frequency synthesizer 204 in combination with timing selector circuit 206. Referring to FIG. 4, an input signal from the crystal oscillator 100 is supplied to the reference clock input terminal 202 of a phase detector 260 and is also supplied to an input of the timing selector circuit 206. Phase detector 260 has an output coupled to an input of a low pass filter circuit 262. Low pass filter circuit 262 also receives bandwidth control signals from frequency control register 240 which are supplied at input terminal 264 to select the bandwidth of low pass filter 262. An ON/OFF control signal from frequency control register 240 is coupled to a second input terminal 266 of the filter 262 to enable or disable the operation of the low pass filter. An analog output signal from the low pass filter 262 is coupled to an input of voltage controlled oscillator 268. The ON/OFF control signal is also supplied to an input of the voltage controlled oscillator 268. The output from the voltage controlled oscillator 268 is supplied as an input to timing selector 206 and to an input of modulo divider 270. The output of modulo divider 270 is connected to an additional input of phase detector 260. Modulo control signals 257 and 259 from frequency control register 240 are supplied to additional inputs of modulo divider 270 to allow software control of the synthesizer frequency. Finally, clock selector control signals 249 and 251 from frequency control register 240 are supplied to additional input terminals of timing selection 206. The output signal from timing selector 206 is supplied to the clock input terminal 110 of microcomputer 104.

In operation, the elements of the phase-locked loop, namely phase detector 260, low pass filter 262, VCO 268, and divider 270 function in accordance with the well-known principles of phase-locked loop theory to synchronize the phase and frequency of the VCO output signal with the phase and frequency of the input timing signals, or more specifically, with the crystal controlled clock signals of oscillator 100 applied to terminal 202. When the loop is locked or synchronized, the frequency, $f_{syn}$, of the VCO output signal will be related to the frequency, $f_{ref}$, of the crystal clock signal by the expression:

$$f_{syn} = M \times f_{ref}$$

where M is the modulus of divider 270.

More specifically, phase detector 260 compares the phase of the crystal clock reference signal $f_{ref}$ with the phase of the output signal from the divider that has a frequency of $f_{syn}/M$, and generates an output signal that is proportional to the difference between the phases of the two signals. This output signal is then applied to the input of low pass filter 262, which shapes the frequency spectrum of the signal from the phase detector, and applies the shaped signal to the frequency control input terminal of the voltage controlled oscillator 268.

The bandwidth characteristics of low pass filter 262 directly affect the time that is required for the phase locked loop to achieve initial synchronization, or a "locked" condition. In the preferred embodiment of the present invention, a low pass filter configuration in which the bandwidth characteristic can be changed between a wide bandwidth state and a narrow bandwidth state is utilized. When the phase-locked loop system is first turned on, the bandwidth input control signal is used to place the filter 262 in a wide bandwidth state. Then, after the loop has locked, the filter is switched through a signal at terminal 264 to the narrow bandwidth mode to reduce the noise on the frequency control input terminal of VCO 268. Low pass filter element 262 also has an ON/OFF control input to disable the low pass filter circuit and place it in a zero power drain mode when the frequency synthesizer is turned OFF.

Voltage controlled oscillator 268 performs a well-known function. It generates an output signal that has a frequency that is directly related to the value of the voltage applied to an input frequency control input; specifically:

$$f_{syn} = K \cdot V_{IN}$$

where K is a constant that is determined by the particular circuit parameters. In the preferred embodiment, the VCO responds to an ON/OFF control signal input by disabling the function of the VCO and also placing it in a state in which no power is drawn from the power supply. Thus, both low pass filter 262 and VCO 268 can, in effect, be turned off.

The output signal from the VCO is supplied to the divider 270 which acts to divide the frequency of the applied signal by an integer whose value is determined by the control signals on lines 257 and 259 that are supplied to the divider 270 by frequency control register 240 in microcomputer 104. In a typical application, this divisor may range in magnitude from 10 to 160 when a 32 kHz signal is used, as the reference frequency $f_{ref}$. An important aspect of the present invention is that this divisor may be controlled by the software program being executed.

When the phase locked loop system is first turned ON, the ON/OFF control signal is switched to the ON state, and low pass filter circuit 262 and VCO 268 are both switched to their normal operational states. The bandwidth control signal is switched to the wide bandwidth mode to provide for the rapid acquisition or locking of the phase-locked loop. In this initial state, the error signal generated by the phase detector acts to drive the VCO frequency $f_{syn}$ to $M \cdot f_{ref}$ so that the output signal from divider 270, can be phase locked to the crystal oscillator reference signal. After a suitable time delay in which it can be assumed that the phase locked loop has locked, the state of the bandwidth control line is switched to the narrow bandwidth mode to reduce the noise jitter at the output of the VCO, and the synthesized output signal is ready to be used as a clock signal source. The output of the synthesizer, i.e., the VCO output, and the crystal oscillator reference signal are both supplied to inputs of the timing selector circuit 206, and a clock selector control signal from frequency control register 240 is used to select which of these signals is supplied to CPU clock terminal 110.

The preferred phase detector, low pass filter, VCO, and timing selector circuit shown in block diagram form in FIG. 4 are shown in greater detail in FIGS. 5A, 5B, 5C and 5D, respectively. The principles for designing an appropriate programmable frequency divider are well-known in the art, and there are many standard components, such as the MC14526B CMOS Programmable Divide by N circuit manufactured by Motorola, Inc., that can be used to perform the indicated function. Thus, the design details of the frequency divider circuit need not be discussed as those skilled in the art will be quite familiar with the operation of such circuits.

Figure 5A:
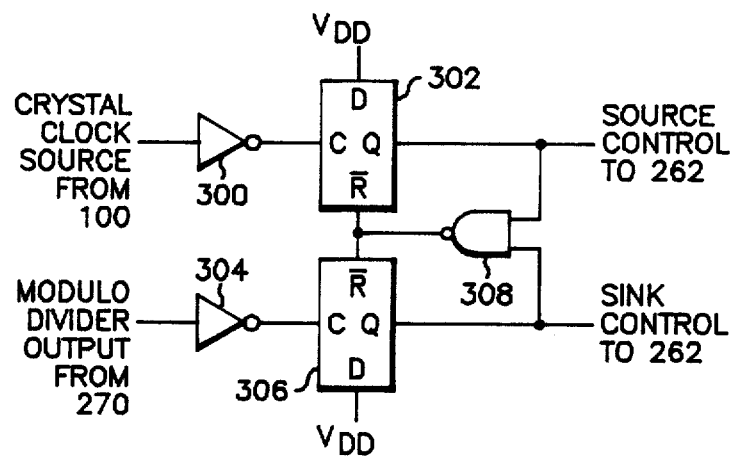
FIGS. 5A, 5B, 5C, and 5D show the detailed circuits for the elements shown in FIG. 4.

FIG. 5A is an electrical schematic diagram of the preferred phase detector circuit 260. The circuit configuration is similar to that for a conventional edge triggered phase detector. The crystal oscillator reference signal is applied to an input of an inverter 300. The output of inverter 300 is coupled to the clock input terminal of "D" flip-flop 302. The output of the modulo divider 270 is supplied to an input of an inverter 304. The output of inverter 304 is coupled to the clock input terminal of "D" flip-flop 306. The data input terminals of flip-flops 302 and 306 are each coupled to the positive voltage supply, $V_{DD}$. The Q output terminal of flip-flop 302 is coupled to an input of a NAND gate 308 and is also labeled as a "Source Control" signal. The Q output terminal of flip-flop 306 is coupled to a second output terminal of NAND 308 and is also labeled as a "Sink Control" signal. The output NAND 308 is coupled to the RESET inputs of flip-flops 302 and 306.

In operation, the phase detector generates two error signal outputs that are indicative of the relative phasing of the waveforms of the crystal clock source signal and modulo divider 270 output signal. Specifically, if the crystal clock source signal undergoes a 1 to 0 transition while the divider output signal remains at either logic level, the output of inverter 300 switches from a 0 to a 1 level, and this transition clocks flip-flop 302 and sets its Q output to a 1 level because its "D" input is electrically tied to a logic 1 level. The resultant 1 level on the Source Control output signal is indicative that the phase of the crystal clock source waveform is leading the phase of the output signal of divider 270.

When the output waveform of divider 270 subsequently undergoes a 1 to 0 level transition, the output of inverter 304 switches from a 0 to a 1 level, and this transition clocks flip-flop 306 and sets its Q output to a 1 level since its D input is electrically tied in a logic 1 level. The 1 level of the Sink Control signal supplies a 1 level to the second input of NAND 308, and its output subsequently switches from a 1 level to a 0 level. This 0 level acts to reset both flip-flops 302 and 306. The Source Control signal at the Q output of flip-flop 302 and the Sink Control signal at the Q output of flip-flop 306 are then reset to a 0 level until one of the input signals to the phase detector again undergoes a 1 to 0 level transition.

The operation of the phase detection circuit is similar if the output signal of divider 270 undergoes a 1 to 0 level transition while the crystal oscillator reference waveform remains at either a 1 or 0 level, but in this case, the Sink Control signal goes high (i.e. to a 1 level) until the crystal clock source waveform undergoes a 1 to 0 level transition. Then, both flip-flops 302 and 306 are again reset until one of the inputs again undergoes a 1 to 0 level transition. In this latter case, the 1 level that appears for the Sink Control signal is indicative that the phase of the output signal of divider 270 is leading the phase of the crystal oscillator waveform.

The Source Control and Sink Control output signals of phase detector 260 are supplied to corresponding Source Control and Sink Control inputs of low pass filter 262. In general, the signals act to raise the input voltage to and therefore the output frequency of VCO 268 when the phase of the signal from the divider 270 lags the phase of the crystal clock reference signal. Conversely, the signals act to lower the input voltage to and therefore the output frequency of VCO 268 when the phase of the crystal clock reference signal lags the phase of the signal from divider 270. This mode of operation controls the VCO 268 in the manner needed to insure that the phase-locked loop will indeed lock.

Figure 5B:
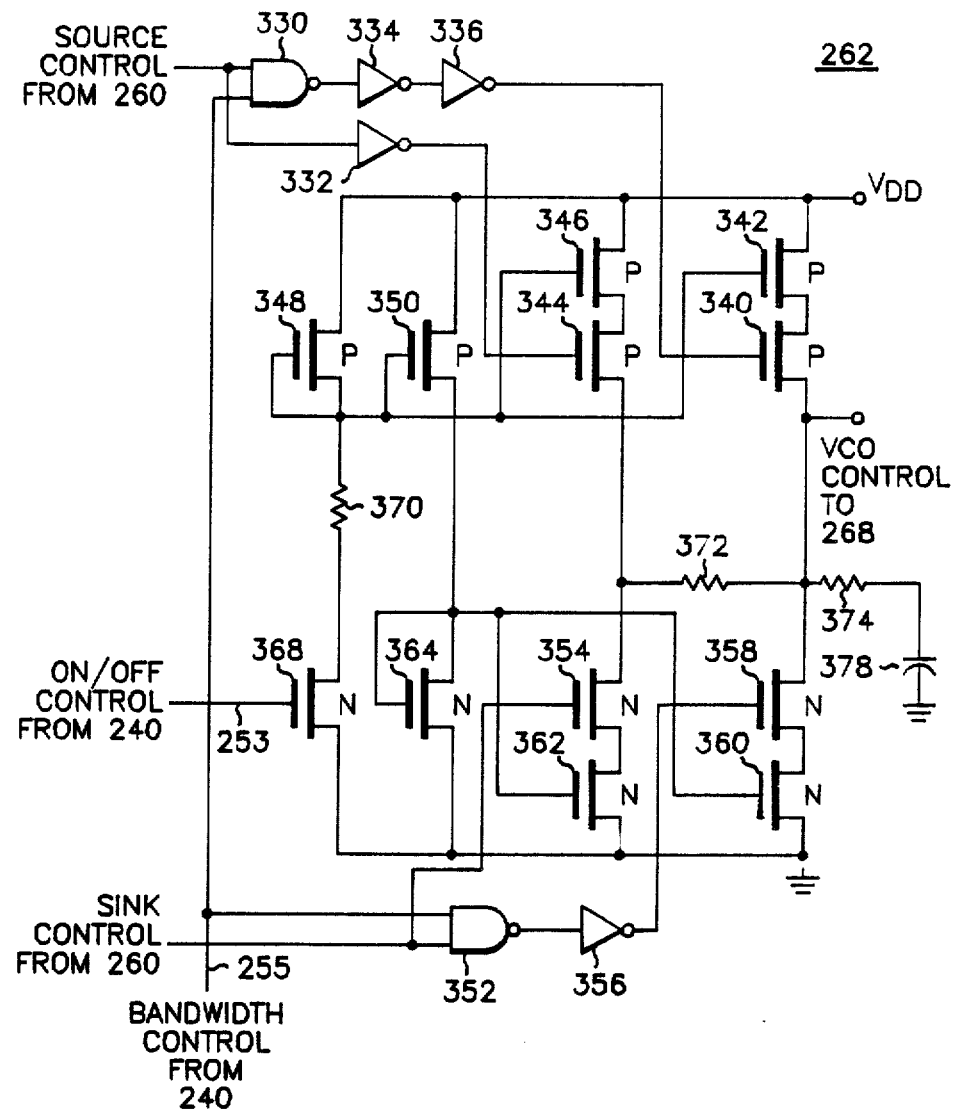

The circuit details of the low pass filter 262 are shown in FIG. 5B. Here the Source Control signal is connected to one input of a NAND gate 330 and to the input of an inverter 332. The output of NAND 330 is coupled to the input of an inverter 334, and the output of inverter 334 is connected to the input of a second inverter 336. The output of inverter 336 is coupled to the gate electrode of an enhancement mode P-channel MOS transistor 340. The source electrode of transistor 340 is coupled to the drain electrode of an enhancement mode P channel MOS transistor 342. The source electrode of transistor 342 is coupled to the positive voltage supply terminal.

The output of inverter 332 is connected to the gate electrode of an enhancement mode P-channel MOS transistor 344, and the source electrode of transistor 344 is connected to the drain electrode of an enhancement mode P-channel transistor 346. The source electrode of transistor 346 is connected to the positive supply terminal. The gate electrodes of transistors 342 and 346 are coupled together, to the gate electrodes of enhancement mode P-channel transistors 348 and 350, and also to the drain electrode of transistor 348. The source electrodes of transistors 348 and 350 are both connected to the positive supply terminal.

The Sink Control signal from 260 is supplied to one input of a NAND gate 352 and to the gate terminal of enhancement mode N-channel transistor 354. The output of NAND 352 is coupled to the input of an inverter 356, and the output of inverter 356 is coupled to the gate electrode of enhancement mode N-channel transistor 358. The bandwidth control signal from 240 is coupled to a second input of NAND 352 and to a second input of NAND 330. The source electrode of transistor 358 is connected to the drain electrode of enhancement mode N-channel transistor 360. The source electrode of transistor 360 is coupled to ground potential. The source electrode of transistor 354 is coupled to the drain electrode of an enhancement mode N-channel transistor 362 whose source electrode is coupled to ground potential. The gate electrodes of transistors 360 and 362 are coupled together and to the gate and drain electrodes of enhancement mode N-channel transistor 364 whose source electrode is coupled to ground potential. The drain electrode of transistor 364 is coupled to the drain electrode of transistor 350. The ON/OFF control signal is supplied to the gate electrode of an enhancement mode N-channel transistor 368 whose source electrode is coupled to the ground potential. The drain electrode of transistor 368 is coupled through a resistor 370 to the drain and gate electrodes of transistor 348.

Finally, the drain electrodes of transistors 344 and 354 are coupled together and to one terminal to a resistor 372. The other terminal of resistor 372 is connected to the drain terminals of transistors 340 and 358 and to one terminal of resistor 374. The other terminal, of resistor 374 is coupled through a capacitor 378 to ground potential. The drain electrode of transistor 340 supplies a signal designated as VCO control.

In operation, transistors 348, 350, 364, 368 and resistor 370 form a CMOS current mirror bias network that is used to establish the gate bias voltages for transistors 342, 346, 360, and 362. When the ON/OFF control signal is in the OFF state, the voltage level is near ground potential and transistor 368 is switched OFF. This in turn causes transistors 342, 346, 348, 350, 360, 362 and 364 to be biased in the OFF state, and the circuit is inoperative and therefore drains zero power.

When the ON/OFF control signal has a logic 1 level to turn the system ON, switch transistor 368 becomes highly conductive, and a current flow is established through transistor 348 and resistor 370 that is primarily determined by the values of the positive supply and resistor 370. The current may be expressed as:

$$I = (V_{supply} - V_{gs})/R\ 370,$$

where $V_{gs}$ is the gate to source voltage of transistor 348 when biased to conduct the current I.

The bias established at the drain electrode of transistor 348 is then sufficient to bias the P-channel transistors 350, 346, 342 at the gate to source voltage potential required to generate drain currents of AI where A depends upon the size of the transistor in question relative to the size of transistor 348, and I is the current bias in transistor 348.

Similarly, the current flow from transistor 350 to transistor 364 establishes a bias that acts to bias the N-channel devices 360 and 362 at the gate to source voltage required to generate a drain current of BI where B is a factor that is dependent on the size of either transistor in question relative to the size of transistor 364.

The P-channel transistors 342 and 346 function as ratioed current sources that generate currents of 50 and 1 microamperes, respectively. Similarly, N-channel transistors 360 and 362 function as ratioed current sinks of 50 and 1 microamperes, respectively.

When the source control signal is switched to a high logic state, the output of inverter 332 is switched to a 0 level which results in switch transistor 344 being turned ON. If the bandwidth control signal is also at a high or logic 1 level NAND 330 is at a 0 level as is the output of inverter 336. This latter signal acts to turn ON switch transistor 340. Conversely, if the bandwidth control signal is at a zero level, only switch transistor 344 is turned on. The net result is that a 1 level input signal of the source control signal causes a current source to be turned ON to charge capacitor 378 through the resistor network formed by resistors 372 and 374.

In the narrow-bandwidth mode, capacitor 378 is charged by transistor 346 through the resistors 372 and 374, and in the wide-bandwidth mode, the capacitor is charged by transistor 346 through resistors 372 and 374, and by transistor 342 through resistor 374. The magnitudes of the currents are determined by the sizes of transistors 342 and 346 relative to transistors 348, and can be determined by CMOS current mirror considerations that are well known in the art.

Similarly, when the Sink Control signal is switched to a high state and if the bandwidth control signal input is at a one level, switch transistors 354 and 358 are turned ON by means of the resultant one signal levels that are applied to their inputs. Conversely, if the bandwidth control signal is at a zero level it only acts to turn on transistor 354, and transistor 358 remains OFF due to the 0 level input applied to one input of NAND 352.

Thus, a 1 level on the Sink Control signal line causes a current sink to be turned on that discharges capacitor 378 through the resistor network formed by resistors 372 and 374. In the narrow bandwidth mode, capacitor 378 is discharged by transistor 362 through resistors 372 and 374, and in the wide bandwidth mode, the capacitor is discharged by transistor 362 through resistors 372 and 374 and by transistor 360 through resistor 374. Again the magnitude of the discharging currents are determined by the sizes of transistors 362 and 360 relative to transistor 364.

In the preferred embodiment, the charging current of transistor 346 and the discharging current of transistor 362 are both set equal to 1 microamperes. Similarly, the charging current of transistor 342 and the discharging current of transistor 360 are both set equal to 50 microamperes. Thus, in the narrow bandwidth mode, the network formed by resistors 372 and 374 and capacitor 378 is charged and discharged with equal currents of 1 microampere, and in the wide bandwidth mode, the network is charged and discharged with equal currents of 51 microamperes.

As is well known in the art, and fully explained in U.S. Pat. No. 4,167,711 entitled "Phase Detector Output Stage for Phase Locked Loop" to Smoot which is assigned to the assignee of the present invention and is hereby incorporated by reference; the effect of the dual mode current charging and discharging arrangement is to provide the low pass filter with two effective bandwidths. This in turn results in two bandwidths for the closed loop phase-locked loop system; a wide-band loop that is used to achieve fast lock times, and a narrow band loop that is used to provide good signal-to-noise characteristics at the output of the VCO. Further, resistors 372 and 374 serve to set the damping of the phase locked loop to the desired value for both the wide bandwidth and narrow bandwidth states of the loop.

When interconnected with the phase detector circuit, the low pass filter circuit acts to charge the output capacitor 378 and raise the voltage of the VCO control signal whenever the phase of the output signal from the divider lags the phase of the crystal oscillator reference signal. The increased voltage of the VCO control signal acts to increase the output frequency of the VCO, which in turn serves to increase the phase of the signal at the output of the divider to establish or maintain a locked condition. Conversely, the low pass filter circuit responds to a Sink Control signal that indicates the phase of the output signal from the divider leads the phase of the crystal oscillator reference signal by discharging the output capacitor 378 and lowering the voltage of the VCO control signal, which acts to lower the output frequency of the VCO and decrease the phase of the signal at the divider output to establish or maintain a locked condition.

Figure 5C:
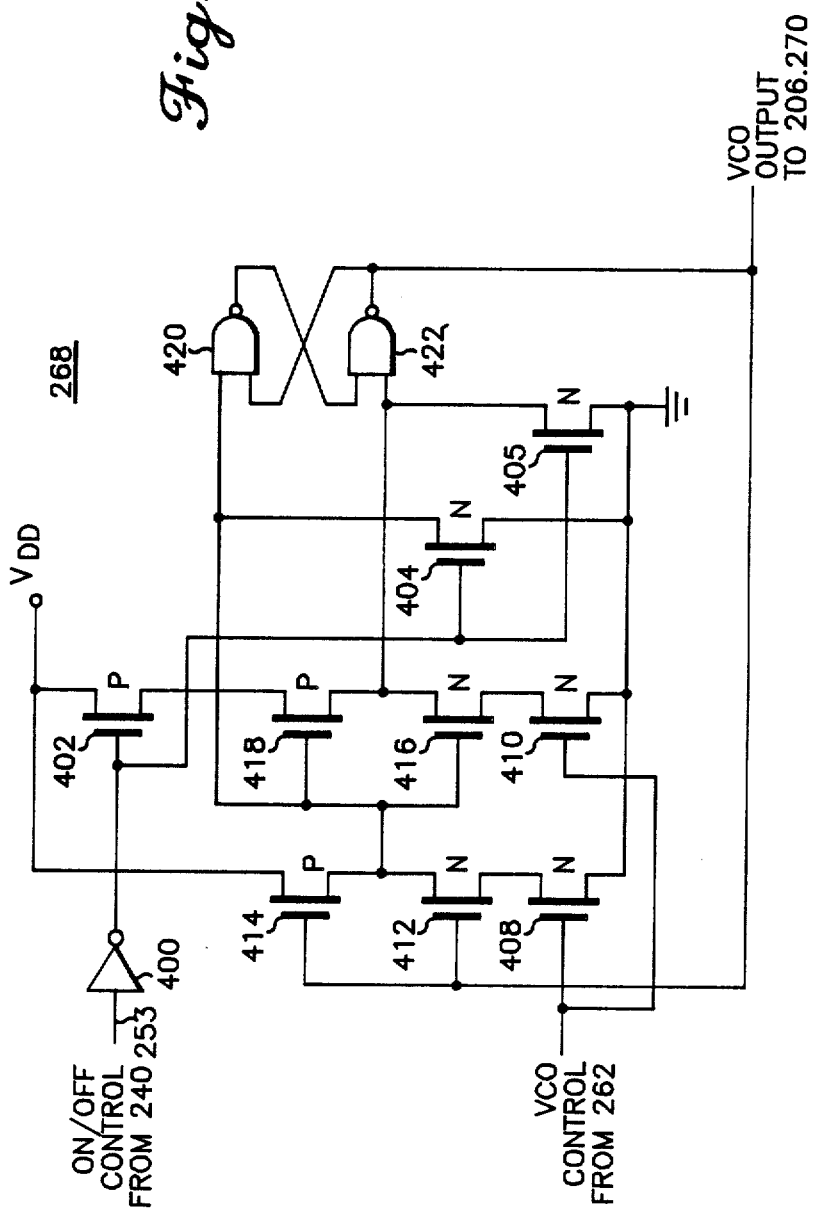

FIG. 5C shows the preferred embodiment of the VCO. The term VCO is used in the generic sense to indicate the function of the element, however the present invention is not limited to the structure shown for the preferred embodiment. The ON/OFF control signal from frequency control registers 240 is connected through an inverter 400 to the gate electrode of an enhancement mode P-channel transistor 402 and to the gate electrodes of enhancement mode N-channel transistors 404 and 405. The source electrode of transistor 402 is coupled to a source of positive potential. The VCO control signal from low pass filter 262 is supplied to the gate electrodes of enhancement mode N-channel transistors 408 and 410. The source electrodes of transistors 404, 405, 408, and 410 are all coupled to ground potential. The drain electrode of transistor 408 is coupled to the source electrode of an enhancement mode N-channel transistor 412. The drain electrode of transistor 412 is coupled to the drain electrode of an enhancement mode P-channel transistor 414 which has its source electrode coupled to a source of positive potential. The drain electrodes of transistors 412 and 414 are coupled together, to the gate electrode of an enhancement mode N-channel transistor 416, to the gate electrode of an enhancement mode P-channel transistor 418, to the drain electrode of transistor 404, and to an input of a NAND gate 420. The source electrode of transistor 416 is coupled to the drain electrode of transistor 410. The source electrode of transistor 418 is coupled to the drain electrode of transistor 402. The drain electrodes of transistors 416 and 418 are coupled together, to the drain electrode of transistor 405 and to an input of a NAND gate 422. The output of NAND gate 420 is connected to a second input of NAND gate 422. The output of NAND gate 422 is connected to a second input of NAND gate 420, the gate electrodes of transistors 412 and 414, and supplies a signal labeled VCO OUTPUT.

The operation of the VCO shown for the preferred embodiment is similar to the operation of Patent #4,110,704 to Irwin, et al., entitled "Astable Multivibrator with Temperature Compensation and Requiring a Single Supply Voltage" which is assigned to the assignee of the present invention and is hereby incorporated by reference. The inverters comprised of transistors 414 and 412, and of transistors 416 and 418 incorporate a voltage controlled delay due to the current limiting effects of transistors 408 and 410, while the R-S latch comprised of NANDS 420 and 422 provides the gain needed for large signal oscillation.

As the VCO input control voltage is increased, the bias currents generated by transistors 408 and 410 increase. The increased bias currents in turn reduce the switching delay times of the inverter pairs 412, 414 and 416, 418, which increases the output frequency of the circuit. Thus, the VCO responds to an increase in the control input voltage by increasing the frequency of the output signal. The VCO is switched ON and OFF by transistors 402, 404 and 405.

When the ON/OFF control signal is at a 1 level, the output of inverter 400 is driven to a 0 level. The 0 level turns on switch transistor 402 and turns OFF transistors 404 and 405. In this condition, the inverter formed by transistors 416 and 418 is connected to the positive supply and NANDS 420 and 422 are free to switch in accordance with the output swings of the multivibrator. When the ON/OFF line is at a 0 level, the output of inverter 400 is at a 1 level, and transistor 402 is then OFF and transistors 404 and 405 are turned ON. In this state, the inverter formed by devices 416 and 418 is effectively disconnected from the supply terminal, and the circuit nodes connected to the drain electrodes of transistors 404 and 405 are switched to ground. Thus, the circuit function is disabled, and the power drain of the VCO is reduced to zero.

Figure 5D:
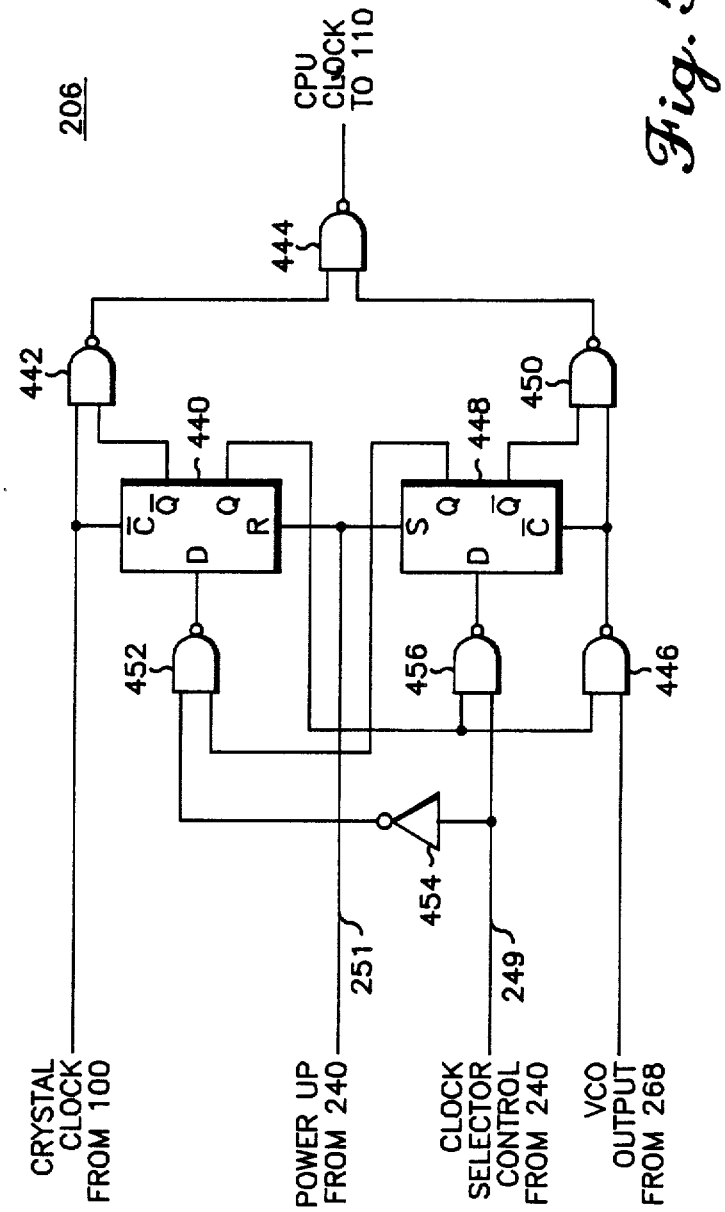

FIG. 5D shows the detailed electrical schematic for timing selector 206 previously shown in FIGS. 3 and 4. The crystal clock source from crystal oscillator 100 is coupled to the clock input terminal of a D type flip-flop 440 and to an input of a NAND gate 442. The Q output terminal of flip-flop 440 is coupled as the second input of NAND 442. The output of NAND 442 is coupled to an input of a NAND gate 444. The signal from the frequency synthesizer VCO output (from 268) is supplied to a first input of a NAND gate 446. The output of NAND 446 is coupled to the clock input terminal of a second D-type flip-flop 448 and to a first input of a NAND gate 450. The Q output terminal of flip-flop 448 is coupled to the second input of NAND 450. The Q output terminal of flip-flop 448 is coupled to an input of a NAND gate 452. The clock selector control signal 249 from frequency control register 240 is applied to a first input of a NAND gate 456 and through an inverter 454 to the second input of NAND 452. The output of NAND 452 is coupled to the D input terminal of flip-flop 440. The Q output terminal of flip-flop 440 is coupled to the second input of NAND 456 and to the second input of NAND 446. A reset control signal line 251 from frequency control register 240 is coupled to the reset terminal of flip-flop 440 and to the set terminal of flip-flop 448. The output of NAND 450 is coupled to the second input of NAND 444. The output of NAND 444 is a signal labeled CPU Clock which is applied to terminal 110 in microcomputer 104.

One of the principle functions of timing selector circuit 206 is to provide a software means of switching between asynchronous clock sources without producing an output pulse width of less duration than the shortest duty cycle of either frequency source. The production of a pulse whose width was less than that required for the CPU to execute an instruction, data or address could cause a malfunction. Since the output frequency of the frequency synthesizer contains slight phase variations, the synthesizer output is not totally synchronous with the reference (crystal clock) source. As such timing selector circuit 206 provides the microcomputer system with a software controlled means of selecting either the crystal source or a higher frequency synthesizer source, without the production of disruptive high frequency spikes or pulses during the transition. As described in FIG. 3, the inclusion of a second timing selector circuit 206 coupled to timer input selector 218 would also allow frequency synthesized clock pulses to be used by elapsed time measurements independently of whether the CPU clock generator had demanded synthesizer operation.

During power up the timing selector circuit 206 is initialized along control line 251 to reset flip-flop 440 and set flip flop 448. The initialization enables a clock signal path from the crystal clock source to the output of selector circuit 206 by resetting flip-flop 440 and enabling NAND gate 442. Initialization also results in the disabling of NAND 446 by flip-flop 440 and the disabling of NAND 450 by flip-flop 448. In this manner no gates are allowed to toggle at the higher synthesizer frequency when the crystal source has been selected as the output. The initialized state for the clock selector line is low to complement the initial flip-flop states.

After initialization, the Power-Up Reset signal is disabled (low). With the clock selector signal line 249 in a low or 0 state, the Crystal Source will continue to send clock signals through enabled NAND's 442 and 444

A principle of the operation of the timing selector circuit 206 is to have a clock pulse edge of the newly selected clock source determine when the clock source transition takes place. This prevents narrow spikes or pulses from being generated at the output and, hence, applied to the microcomputer. This is a particular important feature of the selector, since narrow spikes or pulses of either polarity in the clock signal applied to the microcomputer can cause its internal timing elements to malfunction, resulting in a disruption of the program being executed. Further, to prevent both clock sources from being applied to the output at the same time,. all selection changes require that one path be disabled before the other path can be enabled.

In operation, a power up reset signal is applied to line 251 from the frequency control register 240. This logic 1 level signal acts to reset flip-flop 440 and set flip-flop 448, which in turn sets the Q out<put of 440 to a 0 level, the Q output of the 440 to a 1 level, the Q output of 448 to a 1 level, and the Q output of 448 to a 0 level.

The initial state of clock selector control line is a 0 level, which results in a 1 at the output of inverter 454. This latter signal, together with the 1 level Q output of flip-flop 448, generates a 0 level signal at the output of NAND 452 which is applied to the D input of flip-flop 440.

Further, the 0 level signal at the Q output of flip-flop 440 causes 1 level signals to be generated at the outputs of NANDS 446 and 456. The 0 level at the $\bar{Q}$ output of flip-flop 448 generates a 1 level at the output of NAND 450. In this state, the outputs of NANDS 442 and 444 are switched in synchronism with the oscillator signal from 100, and the output of the crystal oscillator is applied to the CPU clock terminal 110.

When the clock selector control line 249 is raised to a logic 1 level to effect the selection of the synthesizer output as the CPU clock, the circuit synchronizes the clock source transition with the waveforms of the two clock sources to prevent the formation of short pulses in the output waveform. Thus, the 1 level on line 249 generates a 0 level at the output of inverter 454. This in turn generates a 1 level at the output of NAND 452 and the D input of flip-flop 440.

Then, on the next negative transition of the crystal oscillator waveform, the Q output of flip-flop 440 is changed to a 1 level and the $\bar{Q}$ output is changed to a 0 level. The 0 level $\bar{Q}$ output of 440 forces a 1 level at the output of NAND 442 and disconnects the crystal oscillator signal from the output connected to the CPU clock input terminal 110 The 1 level at the Q output of 440 acts to generate a 0 level at the output of gate 456 and the D input of flip-flop 448. Then, on the next positive transition of the VCO output waveform, the output of NAND 446 and the clock terminal of flip-flop 448 are switched from a 1 level to a 0 level. This transition clocks the flip-flop to generate a 1 level at its $\bar{Q}$ output and a 0 level at its Q output. This condition results in the output signal from the synthesizer being applied to the CPU clock input terminal 110 through NANDS 446, 450, and 444. Thus, the clock source transposition takes place with the next full cycle of the new clock source waveform following a transition of the old clock source waveform, and no narrow pulses or glitches are generated. In addition, the circuit operates in a similar manner when the clock source control line is switched from a 1 level to a 0 level to effect a change from the frequency synthesizer clock source to the crystal oscillator source.

Figure 6:
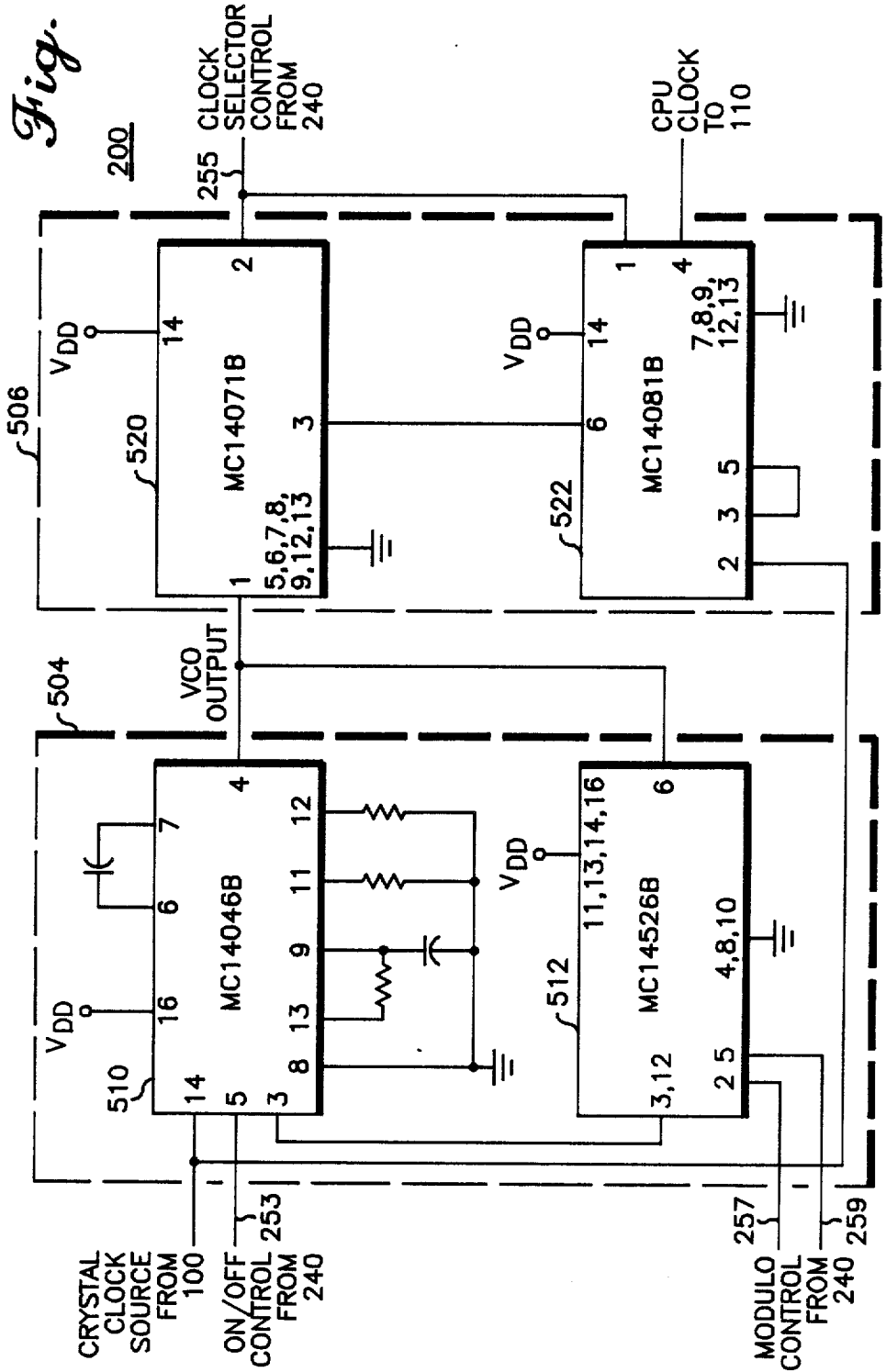
FIG. 6 shows an alternative embodiment for the frequency synthesized timing generator of FIG. 4.

FIG. 6 shows an alternate embodiment of frequency synthesizer 204 and timing selector logic 206 which are designated as 504 and 506, respectively. It will be appreciated that while they perform the same function, they are not identical with the apparatus of the preferred embodiment. Frequency synthesizer 504 is seen to comprise two IC circuits designated as 510 and 512. IC 510 is a frequency synthesizer preferably a MC14046B; IC 512 is a programmable divide by counter preferably a MC14526B. The interconnection shown provides the appropriate frequency synthesis operation. Crystal clock source is supplied to pin 14 of IC 510 and the ON/OFF control signal is supplied to pin 5. The VCO output signal is produced at pin 4.

Modulo control signals from the frequency control register 240 are supplied to pins 2 and 5 of IC 512. As has been stated, the selection of the synthesizer frequency through modulo control signals can be under control of the program being executed by the microcomputer.

The VCO output signal is supplied to pin 1 of an IC 520 which is used as an OR gate and is preferably an MC14071B. The clock selector control signal 255 is supplied to pin 2 of IC 520. Crystal clock source from 100 is supplied to pin 2 of an IC 522 which is used as an AND gate and is preferably a MC14081B. IC's 520 and 522 are combined to form alternative clock selector 506. The CPU clock signal is produced at pin 4 of IC 522.

In operation, IC's 510 and 512 provide the operation of frequency synthesizer 504 which includes a phase detector, low pass filter, VCO, and modulo divider. This is not intended to be limiting as those skilled in the art will appreciate that very large numbers of frequencies may be produced depending upon the parameters of the synthesizer and the reference timing signal supplied to it from 109 as shown in FIG. 2. Moreover, the present invention has the distinct advantage of enabling the frequency to be selected by the program being executed by the microcomputer.

Turning now to the timing diagrams shown in FIG. 7A-7G, the overall timing operation of the present invention can be summarized based on the previous descriptions of the operation of the elements in the system. At some time prior to time T0, the system has been activated, and the crystal oscillator begins generating the low frequency waveform shown in FIG. 7A. Due to the initialization technique used in the microcomputer to set the control registers to predetermined states, the clock selector control line 249 from the frequency control register is set to a 0 logic level to select the crystal oscillator output as the signal applied to CPU input terminal 110, as denoted in the waveforms of FIGS. 7B and 7C for the clock selector control line 249 and the CPU clock 110, respectively.

Figure 7:
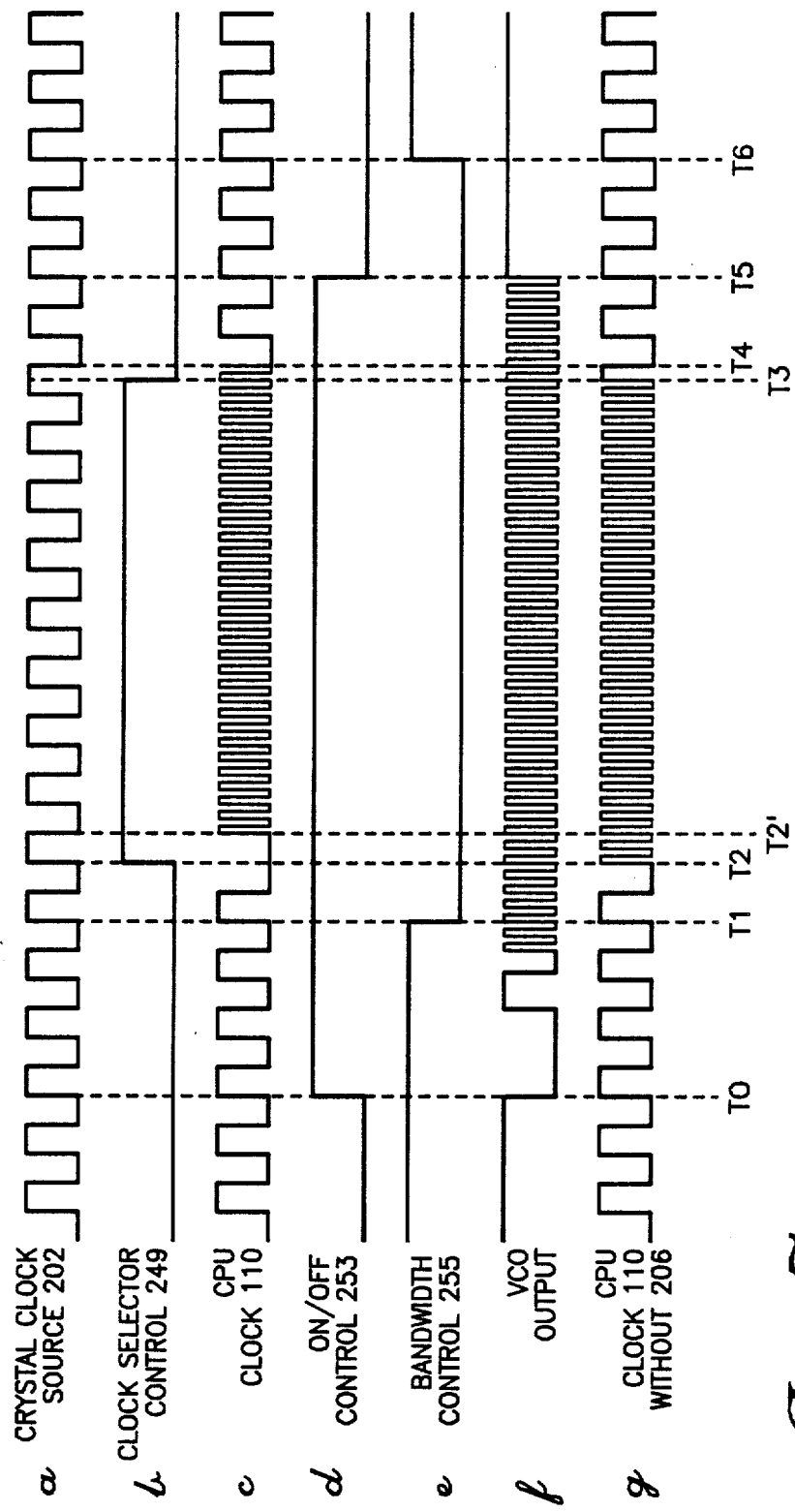
FIGS. 7A, 7B, 7C, 7D, 7E, 7F, and 7G are timing charts that are useful in explaining the operation of the circuit shown in FIGS. 3, 4 and 5A-D.

At line T0, the microcomputer turns on the frequency synthesizer and sets the bandwidth of phase locked loop to the wide bandwidth mode as shown in waveforms of FIGS. 7D and 7E, respectively. This action is accomplished by writing the appropriate control sequence into the frequency control register 240, and switching the ON/OFF control line 253 to a logic 1 level and the bandwidth control line 255 to a logic 1 level.

Referring to FIG. 7F, after the frequency synthesizer has been switched ON, the frequency of the output signal from the VCO begins to increase until the phase locked loop in the synthesizer locks at the frequency value that has been selected by the state of the frequency control lines 257 and 259.

At time T1, which is selected to occur after the phase locked loop has locked, the microcomputer writes a second control sequence into frequency control register 240 to change the state of bandwidth control line 255 to a logic level 0, or narrow bandwidth state.

After a short delay to allow any transients caused by the bandwidth change to die out, the microcomputer writes another control sequence into the frequency control register to change the state of clock selector line 249 to a logic 1 level as shown by the waveform of FIG. 7B at time T2. This change applies the output of the frequency synthesizer to the CPU clock input terminal 110, as shown by the change in waveforms of FIG. 7C at time T2 as described earlier in the detailed description of FIG. 5D.

After some period of operating at the high frequency clock generated by the frequency synthesizer, the microcomputer switches the CPU clock back to the output of the crystal oscillator at time T3. This is accomplished by writing a control sequence into the frequency control register to change the state of clock selector control line 249 to a logic 0 level. At T3, the waveforms of FIGS. 7B and 7C show the selector control and the CPU clock waveform.

At time T5, the microcomputer turns the frequency synthesizer off. Here again, this is accomplished by writing a control sequence into the frequency control register to change the state of ON/OFF control line 253 to a logic 0 level.

FIG. 7E shows that at time T6, the microcomputer has written a sequence into the frequency control register to change the state of the bandwidth control signal to the logic level 1, or wideband state. This has been done so that the phase locked loop will lock rapidly when the frequency synthesizer is turned on again for the next cycle of high speed operation.

Finally, FIG. 7G shows the generation of a short duration pulse between times T3 and T4 which if allowed to pass onto CPU input 110 could cause execution problems. The operation timing control circuit prevents the passage of such spikes and delays changing clock sources until the next full clock pulse of the newly selected clock source can be provided.

Obviously, numerous additional modifications and variations of the present invention are possible in light of the above teachings. It is, therefore, to be understood that within the scope of the appended claims, the invention may be practiced otherwise than as specifically described herein.

What is claimed is:

1. A microcomputer system capable of operating with minimum power comprising:
   a central processing unit including means designating the predetermined clock pulse frequency requirements of the central processing unit for the immediate execution of programmable tasks;
   stable frequency source producing timing pulses at a frequency less than the largest in magnitude of the predetermined clock pulse frequency requirements of the central processing unit; and
   a frequency synthesizer coupled to and receiving timing pulses from said stable frequency source, said frequency synthesizer being coupled to said central processing unit for generating and supplying synthesized clock pulses to said central processing unit, said synthesizer including selecting means, responsive to said designating means, for selecting an output frequency of the synthesized clock pulses equal to the predetermined clock pulse frequency requirements of said central processing unit;
   whereby the total power consumed by the elements of the microcomputer system is minimized by the operation of the stable frequency source at a frequency less than the largest in magnitude of the clock pulse frequency requirements of the central processing unit and the generation by the frequency synthesizer and supply of clock pulse frequencies to the central processing unit is no greater than that required for the immediate execution of programmable tasks.

2. The microcomputer system of claim 1 further including memory means coupled to said central processing unit containing programmed instructions and wherein said designating means is responsive to said programmed instructions to designate said clock pulse frequency requirements.

3. The microcomputer system of claim 2 wherein said selecting means includes a timing selector coupled to and receiving timing pulses from said stable frequency source and said frequency synthesizer, for alternatively enabling the supply of synthesized clock pulses or stable frequency source pulses to said central processing unit.

4. The microcomputer system of claim 3 wherein said central processing unit further includes timer/counter means for recording elapsed time intervals and said timing selector means further includes means for alternatively enabling the and said timer/counter means for alternatively enabling the supply of synthesized clock pulses or stable frequency source pulses to said timer/counter.

5. The microcomputer system of claim 3 wherein said timing selector includes means responsive to said designating means to switch the source of pulses supplied to said central processing unit between said synthesizer and said stable frequency source,
said timing selector means further including means for maintaining the pulse width of the pulses supplied to the central processing unit from either source at not less than the duration of the normal duty cycle of pulses from either source.

6. The microcomputer system of claim 5 wherein said means for maintaining the pulse width includes delay means responsive to said designating means to delay switching of the source of pulses to the central processing unit until a full pulse width timing signal from the newly selected source can be provided.

7. The microcomputer system of claim 6 wherein said delay means includes means responsive to an edge of a first full clock pulse from either source that is detected subsequent to switching for enabling circuitry to direct said clock pulse to said central processing unit.

8. The microcomputer system of claim 3 wherein said selecting means further includes actuation means responsive to said designating means in said central processing unit to actuate power to said synthesizer.

9. The microcomputer system of claim 8 wherein said actuation means include s means to now allow disruption of power to the synthesizer as long as said designating means requires it.

10. An energy efficient microcomputer system comprising:
a microcomputer, including a central processing unit, having a plurality of predetermined clock pulse frequency requirements for the immediate execution of programmable tasks and including means for designating said requirements;
a stable frequency source operative to produce timing pulses at a frequency which is less than the largest in magnitude of said plurality of predetermined clock pulse frequency requirements; and
a frequency synthesizer coupled to said microcomputer and to said stable frequency source for generating and supplying synthesized clock pulses, said synthesizer including selecting means responsive to said designating means for selecting an output frequency of the synthesized clock pulses at frequencies equal to the magnitudes of said plurality of predetermined clock frequency requirements of said microcomputer;
whereby the total power consumed by the elements of the microcomputer system are minimized when the said stable frequency source is operated at a frequency which is less than the largest of the predetermined clock pulse frequencies of the central processing unit and said microcomputer receives synthesized clock pulses from said frequency synthesizer at frequencies sufficient to satisfy the predetermined clock frequency requirements for the immediate execution of a programmable tasks.

11. The microcomputer system of claim 10 further including memory means coupled to said central processing unit containing programmed instructions and wherein said designating means is responsive to said programmed instructions to designate said clock pulse frequency requirements.

12. The microcomputer system of claim 11 wherein said selecting means includes a timing selector coupled to and receiving timing pulses from said stable frequency source and said frequency synthesizer, for alternatively enabling the supply of synthesized clock pulses or stable frequency source pulses to said central processing unit.

13. The microcomputer system of claim 12 wherein said microcomputer further includes timer/counter means for recording elapsed time intervals and said timing selector means further includes means coupled between said timing selector and said timer/counter means for alternatively enabling the supply of synthesized clock pulses or stable frequency source pulses to said timer/counter.

14. The microcomputer system of claim 12 wherein said timing selector includes means responsive to said designating means to switch the source of pulses supplied to said microcomputer between said synthesizer and said stable frequency source,
said timing selector means further including means for maintaining the pulse width of the pulses supplied to the microcomputer from either source at not less than the duration of the normal duty cycle for pulses from either source.

15. The microcomputer system of claim 14 wherein said means for maintaining the pulse width includes delay means responsive to said designating means to delay switching of the source of pulses to the microcomputer until a full pulse width timing signal from the newly selected source can be provided.

16. The microcomputer system of claim 15 wherein said delay means includes means responsive to an edge of a first full clock pulse from either source that is detected subsequent to switching for enabling circuitry to direct said clock pulse to said microcomputer.

17. The microcomputer system of claim 12 wherein said selecting means further includes actuation means responsive to said designating means in said microcomputer to actuate power to said synthesizer.

18. The microcomputer system of claim 17 wherein said actuation means includes means to not allow disruption of power to the synthesizer as long as said designating means requires it.

19. For use in a microcomputer system, an energy efficient clock pulse frequency generator for a microcomputer having a plurality of predetermined clock pulse frequency requirements for the immediate execution of programmable tasks to maintain computational capability, comprising:
- a stable frequency source operative to produce timing pulses at a frequency which is less than the largest in magnitude of the plurality of predetermined clock pulse frequency requirements of the microcomputer; and
- a frequency synthesizer for coupling to the microcomputer, including means responsive to the clock pulse frequency requirement of the microcomputer, for selecting an output frequency of the synthesized clock pulses, said frequency synthesizer being coupled to said stable frequency source and generating and supplying synthesized clock pulses at frequencies equal in magnitude to the frequencies of said plurality of predetermined clock pulse frequency requirements of said microcomputer;
- whereby the operation of the stable frequency source at a frequency which is less than the largest in magnitude of the predetermined clock pulse frequency requirements and the operation of the synthesizer at frequencies equal to the clock pulse frequency requirements of the microcomputer results in power consumed by the clock pulse frequency source and frequency synthesizer being minimized while maintaining the computational capability of a microcomputer system.

20. The clock pulse frequency generator of claim 19 wherein said selecting means includes a timing selector receiving timing pulses from said stable frequency source and said frequency synthesizer, for alternatively enabling the supply of synthesized clock pulses or stable frequency source pulses to said microcomputer.

21. The clock pulse frequency generator of claim 20 wherein said timing selector includes means to switch the source of pulses supplied to said microcomputer between said synthesizer and said stable frequency source,
said timing selector means further including means for maintaining the pulse width of the pulses supplied to the microcomputer from either source at not less than the duration of the normal duty cycle for pulses from either source.

22. The clock pulse frequency generator of claim 21 wherein said means for maintaining the pulse width includes delay means to delaying switching of the source of pulses to the microcomputer until a full pulse width timing signal from the newly selected source can be provided.

23. The clock pulse frequency generator of claim 22 wherein said delay means includes means responsive to an edge of a first full clock pulse from either source that is detected subsequent to switching for enabling circuitry to direct said clock pulse to said microcomputer.

* * * * *